(12) United States Patent
Liaw et al.

(10) Patent No.: US 8,489,345 B2
(45) Date of Patent: Jul. 16, 2013

(54) TECHNIQUE FOR DETERMINING PERFORMANCE CHARACTERISTICS OF ELECTRONIC DEVICES AND SYSTEMS

(75) Inventors: Haw-Jyh Liaw, Fremont, CA (US); Xiangchao Yuan, Palo Alto, CA (US); Mark A. Horowitz, Menlo Park, CA (US)

(73) Assignee: Rambus Inc., Sunnyvale, CA (US)

( * ) Notice: Subject to any disclaimer, the term of this patent is extended or adjusted under 35 U.S.C. 154(b) by 113 days.

(21) Appl. No.: 13/245,234

(22) Filed: Sep. 26, 2011

(65) Prior Publication Data

US 2012/0072153 A1 Mar. 22, 2012

Related U.S. Application Data

(60) Continuation of application No. 12/471,044, filed on May 22, 2009, now Pat. No. 8,055,458, which is a continuation of application No. 11/354,964, filed on Feb. 16, 2006, now Pat. No. 7,542,857, which is a division of application No. 10/954,489, filed on Oct. 1, 2004, now Pat. No. 7,006,932, which is a continuation of application No. 09/799,516, filed on Mar. 7, 2001, now Pat. No. 6,920,402.

(51) Int. Cl.
*G01R 15/00* (2006.01)
*G06F 19/00* (2011.01)

(52) U.S. Cl.
USPC ............. 702/57; 702/64; 702/79; 702/117; 324/532

(58) Field of Classification Search
USPC .............. 702/57, 58, 64–67, 69, 71, 72, 79, 702/89, 117, 118; 324/527, 532, 617, 618, 324/624, 626–629; 375/224–226
See application file for complete search history.

(56) References Cited

U.S. PATENT DOCUMENTS 3,288,929 A 11/1966 Hutchinson
3,678,194 A 7/1972 Orrell, Jr.
(Continued)

FOREIGN PATENT DOCUMENTS

EP 0 262 659 4/1988
EP 0 508 459 10/1992
JP 2000-035831 2/2000

OTHER PUBLICATIONS

Rubio et al., "An Approach to the Analysis and Detection of Crosstalk Faults in Digital VLSI Circuits", Mar. 1994, Computer Aided Design of Integrated Circuits and Systems, vol. 13, Issue 3, pp. 387-395.*

(Continued)

*Primary Examiner* — Manuel L Barbee
(74) *Attorney, Agent, or Firm* — Marc P. Schuyler

(57) ABSTRACT

A technique for determining performance characteristics of electronic devices and systems is disclosed. In one embodiment, the technique is realized by measuring a first response on a first transmission line from a single pulse transmitted on the first transmission line, and then measuring a second response on the first transmission line from a single pulse transmitted on at least one second transmission line, wherein the at least one second transmission line is substantially adjacent to the first transmission line. The worst case bit sequences for transmission on the first transmission line and the at least one second transmission line are then determined based upon the first response and the second response for determining performance characteristics associated with the first transmission line.

29 Claims, 8 Drawing Sheets

U.S. PATENT DOCUMENTS

| | | |
|---|---|---|
| 4,430,735 A | 2/1984 | Catiller |
| 4,590,600 A | 5/1986 | Beeman et al. |
| 5,101,347 A * | 3/1992 | Balakrishnan et al. ....... 710/106 |
| 5,110,211 A | 5/1992 | Niki et al. |
| 5,361,398 A | 11/1994 | Christian et al. |
| 5,524,112 A | 6/1996 | Azuma et al. |
| 5,566,214 A | 10/1996 | Kroeger et al. |
| 5,633,607 A | 5/1997 | Millar |
| 5,742,798 A | 4/1998 | Goldrian |
| 5,748,672 A | 5/1998 | Smith et al. |
| 5,793,800 A | 8/1998 | Jylha et al. |
| 5,848,100 A | 12/1998 | Inogai |
| 5,914,996 A | 6/1999 | Huang |
| 5,982,208 A | 11/1999 | Kokubo et al. |
| 6,070,214 A | 5/2000 | Ahern |
| 6,128,319 A | 10/2000 | Ngai |
| 6,205,202 B1 | 3/2001 | Yoshida et al. |
| 6,327,542 B1 | 12/2001 | McBride |
| 6,374,392 B1 | 4/2002 | Ochiai et al. |
| 6,418,494 B1 | 7/2002 | Shatas |
| 6,539,527 B2 | 3/2003 | Naffziger et al. |
| 6,578,180 B2 | 6/2003 | Tanner |
| 6,625,239 B1 | 9/2003 | Shiraishi et al. |
| 6,633,605 B1 | 10/2003 | Katsman et al. |
| 6,775,809 B1 | 8/2004 | Lambrecht et al. |
| 6,920,402 B1 | 7/2005 | Liaw et al. |
| 7,006,932 B1 | 2/2006 | Liaw et al. |
| 7,065,168 B2 | 6/2006 | Dedic et al. |
| 7,542,857 B2 | 6/2009 | Liaw et al. |
| 8,055,458 B2 | 11/2011 | Liaw et al. |
| 2005/0002423 A1 | 1/2005 | Lambrecht et al. |
| 2006/0195805 A1 | 8/2006 | Matsumiya |

OTHER PUBLICATIONS

Rubio et al., "An Approach to the Analysis and detection of Crosstalk Faults in Digital VLSI Circuits," Computer-Aided Design of Integrated Circuits and Systems, vol. 13, Issue 3, pp. 387-395 (1994).

* cited by examiner

1

TECHNIQUE FOR DETERMINING PERFORMANCE CHARACTERISTICS OF ELECTRONIC DEVICES AND SYSTEMS

CROSS-REFERENCE TO RELATED APPLICATIONS

This patent application is a continuation of U.S. patent application Ser. No. 12/471,044 filed May 22, 2009, which is a continuation of U.S. patent application Ser. No. 11/354,964, filed Feb. 16, 2006, now U.S. Pat. No. 7,542,857, which is a divisional of U.S. patent application Ser. No. 10/954,489, filed Oct. 1, 2004, now U.S. Pat. No. 7,006,932, which is a continuation of U.S. patent application Ser. No. 09/799,516, filed Mar. 7, 2001, now U.S. Pat. No. 6,920,402, each of which is hereby incorporated by reference herein in its entirety.

FIELD OF THE DISCLOSURE

The present disclosure relates generally to integrated circuit testing systems and, more particularly, to a technique for determining performance characteristics of electronic devices and systems.

BACKGROUND OF THE DISCLOSURE

A typical data transmission system comprises a transmitter, a receiver, and some form of transmission medium for carrying a data signal from the transmitter to the receiver. A common problem that occurs in such a data transmission system is that the data signal arriving at the receiver may be distorted by Inter-Symbol Interference (ISI). That is, the timing and voltage margins at the receiver are typically dependent upon the transmitted data.

ISI generally occurs due to two mechanisms. First, the timing or voltage of a data signal presently being transmitted on any given transmission line may be affected by residual reflections from prior transmitted data signals on the same transmission line. Second, adjacent transmission lines may have electromagnetic coupling. In such a case, the timing or voltage of data signals transmitted on a given transmission line may be influenced by data signals transmitted on other adjacent transmission lines.

When testing data transmission devices or systems, the operation of such devices or systems is often measured by transmitting long sequences of random data. To some degree, the accuracy of this approach depends upon the probability of the random sequence containing a worst case data pattern. The accuracy of this approach is also dependent upon whether there is significant ISI associated with the device or system. Further, the measurement apparatus may exhibit ISI, thereby introducing an additional uncertainty. In some cases, guardbanding is employed to deal with these uncertainties.

Referring to FIG. 1, there is shown a typical apparatus 10 for testing the operation of an integrated circuit (IC) memory device 12. The apparatus 10 comprises a vector memory 14 for storing random data sequences. The vector memory 14 is connected to a transmitter 16 for transmitting the random data sequences along a transmission line 18 to the IC memory device 12. The apparatus 10 also comprises a receiver 20 for receiving data transmitted from the IC memory device 12 via the transmission line 18, and a result memory 22, connected to the receiver 20, for storing the received data. The operation of the IC memory device 12 is tested by comparing the random data sequences that are transmitted from the vector memory 14 to the IC memory device 12 for storage therein with the same random data sequences after they are transmitted from the IC memory device 12 to the result memory 22 for storage therein. It should be noted that although only one transmitter 16, transmission line 18, and receiver 20 are shown, this arrangement may be duplicated as required based upon the number of input/output (I/O) lines of the IC memory device 12 to be measured.

The apparatus 10 can also be used to attempt to measure the worst case timing and voltage margins of the IC memory device 12 by measuring the output waveforms of the random data sequences after they are transmitted from the IC memory device 12 to the result memory 22. However, since there is no way to know when a worst case random data sequence will occur, every output waveform must be measured. Also, this method is not guaranteed to find the worst case timing and voltage margins since the random data sequences may not include the worst case random data sequence. This is especially true when the outputs of the IC memory device 12 are affected by ISI. In addition, if the apparatus 10 itself has ISI, the measurement result will not accurately reflect the true worst case timing and voltage margins of the IC memory device 12.

In view of the foregoing, it would be desirable to provide a technique for determining performance characteristics of electronic devices and systems which overcomes the above-described inadequacies and shortcomings.

SUMMARY OF THE DISCLOSURE

A technique for determining performance characteristics of electronic devices and systems is disclosed. In one embodiment, the technique is realized by measuring a first response on a first transmission line from a single pulse transmitted on the first transmission line, and then measuring a second response on the first transmission line from a single pulse transmitted on at least one second transmission line, wherein the at least one second transmission line is substantially adjacent to the first transmission line. The worst case bit sequences for transmission on the first transmission line and the at least one second transmission line are then determined based upon the first response and the second response for determining performance characteristics associated with the first transmission line.

In accordance with other aspects of the present disclosure, determining worst case bit sequences beneficially includes determining worst case timing margin bit sequences and worst case voltage margin bit sequences for transmission on the first transmission line and the at least one second transmission line.

In a first case, determining worst case timing margin bit sequences for transmission on the first transmission line beneficially comprises determining the polarity of the first response at data-cell boundaries of the first response. If the polarity at a data-cell boundary is positive, then an associated bit in a first worst case timing margin bit sequence for transmission on the first transmission line is beneficially assigned a logic one value. Alternatively, if the polarity at a data-cell boundary is negative, then an associated bit in the first worst case timing margin bit sequence for transmission on the first transmission line is beneficially assigned a logic zero value. Furthermore, if the polarity at a data-cell boundary is positive, then an associated bit in a complementary worst case timing margin bit sequence for transmission on the first transmission line is beneficially assigned a logic zero value. Alternatively, if the polarity at a data-cell boundary is negative, then an associated bit in a complementary worst case timing margin bit sequence for transmission on the first transmission line is beneficially assigned a logic one value.

In a second case, determining worst case timing margin bit sequences for transmission on the at least one second transmission line beneficially comprises determining the polarity of the second response at data-cell boundaries of the second response. If the polarity at a data-cell boundary is positive, then an associated bit in a first worst case timing margin bit sequence for transmission on the at least one second transmission line is beneficially assigned a logic one value. Alternatively, if the polarity at a data-cell boundary is negative, then an associated bit in the first worst case timing margin bit sequence for transmission on the at least one second transmission line is beneficially assigned a logic zero value. Furthermore, if the polarity at a data-cell boundary is positive, then an associated bit in a complementary worst case timing margin bit sequence for transmission on the at least one second transmission line is beneficially assigned a logic zero value. Alternatively, if the polarity at a data-cell boundary is negative, then an associated bit in a complementary worst case timing margin bit sequence for transmission on the at least one second transmission line is beneficially assigned a logic one value.

In a third case, determining worst case voltage margin bit sequences for transmission on the first transmission line beneficially comprises determining the polarity of the first response at the center of data-cells of the first response. If the polarity at the center of a data-cell is positive, then an associated bit in a first worst case voltage margin bit sequence for transmission on the first transmission line is beneficially assigned a logic one value. Alternatively, if the polarity at the center of a data-cell is negative, then an associated bit in the first worst case voltage margin bit sequence for transmission on the first transmission line is beneficially assigned a logic zero value. Furthermore, if the polarity at the center of a data-cell is positive, then an associated bit in a complementary worst case voltage margin bit sequence for transmission on the first transmission line beneficially is assigned a logic zero value. Alternatively, if the polarity at the center of a data-cell is negative, then an associated bit in a complementary worst case voltage margin bit sequence for transmission on the first transmission line is beneficially assigned a logic one value.

In a fourth case, determining worst case voltage margin bit sequences for transmission on the at least one second transmission line beneficially comprises determining the polarity of the second response at the center of data-cells of the second response. If the polarity at the center of a data-cell is positive, then an associated bit in a first worst case voltage margin bit sequence for transmission on the at least one second transmission line is beneficially assigned a logic one value. Alternatively, if the polarity at the center of a data-cell is negative, then an associated bit in the first worst case voltage margin bit sequence for transmission on the at least one second transmission line is beneficially assigned a logic zero value. Furthermore, if the polarity at the center of a data-cell is positive, then an associated bit in a complementary worst case voltage margin bit sequence for transmission on the at least one second transmission line is beneficially assigned a logic zero value. Alternatively, if the polarity at the center of a data-cell is negative, then an associated bit in a complementary worst case voltage margin bit sequence for transmission on the at least one second transmission line is beneficially assigned a logic one value.

In an alternative embodiment, an improved integrated circuit device is disclosed having a plurality of data transmitters for transmitting data from the integrated circuit device onto respective ones of a plurality of transmission lines. The improvement comprises a plurality of pulse generators electrically connected to respective ones of the plurality of data transmitters. Each of the plurality of pulse generators generates a single pulse data signal for transmission by a respective data transmitter onto a respective transmission line so as to provide a single bit response associated with at least one of the plurality of transmission lines when a first response is measured on a first of the plurality of transmission lines when a respective first data transmitter transmits a single pulse data signal generated by a respective first pulse generator on the first transmission line, and when a second response is measured on the first transmission line when at least one second of the plurality of data transmitters transmits a single pulse data signal generated by at least one respective second pulse generator on at least one respective second transmission line. The at least one respective second transmission line is typically substantially adjacent to the first transmission line.

In another alternative embodiment, an improved integrated circuit device is disclosed having at least one data receiver for receiving data signals from at least one respective transmission line. The improvement comprises a comparator circuit electrically connected to the at least one respective transmission line for acquiring timing and voltage characteristics of data signals propagating along the at least one transmission line prior to being received by the at least one data receiver.

In accordance with other aspects of the present disclosure, the comparator circuit beneficially comprises a comparator device for comparing the voltage level of the data signals propagating along the at least one transmission line with a reference voltage level. The comparator circuit also further beneficially comprises a clock multiplier for multiplying a clock signal to provide the comparator device with an appropriate sample rate.

In still another alternative embodiment, an improved integrated circuit device is disclosed having at least one data receiver for receiving data signals from at least one respective transmission line. The improvement comprises a converter circuit electrically connected to the at least one respective transmission line for acquiring timing and voltage characteristics of data signals propagating along the at least one transmission line prior to being received by the at least one data receiver.

In accordance with other aspects of the present disclosure, the converter circuit beneficially comprises an analog-to-digital converter device for converting the analog voltage level of the data signals propagating along the at least one transmission line into a digital voltage level. The converter circuit also further beneficially comprises a clock multiplier for multiplying a clock signal to provide the analog-to-converter device with an appropriate sample rate.

The present disclosure will now be described in more detail with reference to exemplary embodiments thereof as shown in the appended drawings. While the present disclosure is described below with reference to exemplary embodiments, it should be understood that the present disclosure is not limited thereto. Those of ordinary skill in the art having access to the teachings herein will recognize additional implementations, modifications, and embodiments, as well as other fields of use, which are within the scope of the present disclosure as described herein, and with respect to which the present disclosure may be of significant utility.

BRIEF DESCRIPTION OF THE DRAWINGS

In order to facilitate a fuller understanding of the present disclosure, reference is now made to the appended drawings. These drawings should not be construed as limiting the present disclosure, but are intended to be exemplary only.

DETAILED DESCRIPTION OF EXEMPLARY EMBODIMENTS

Figure 1:
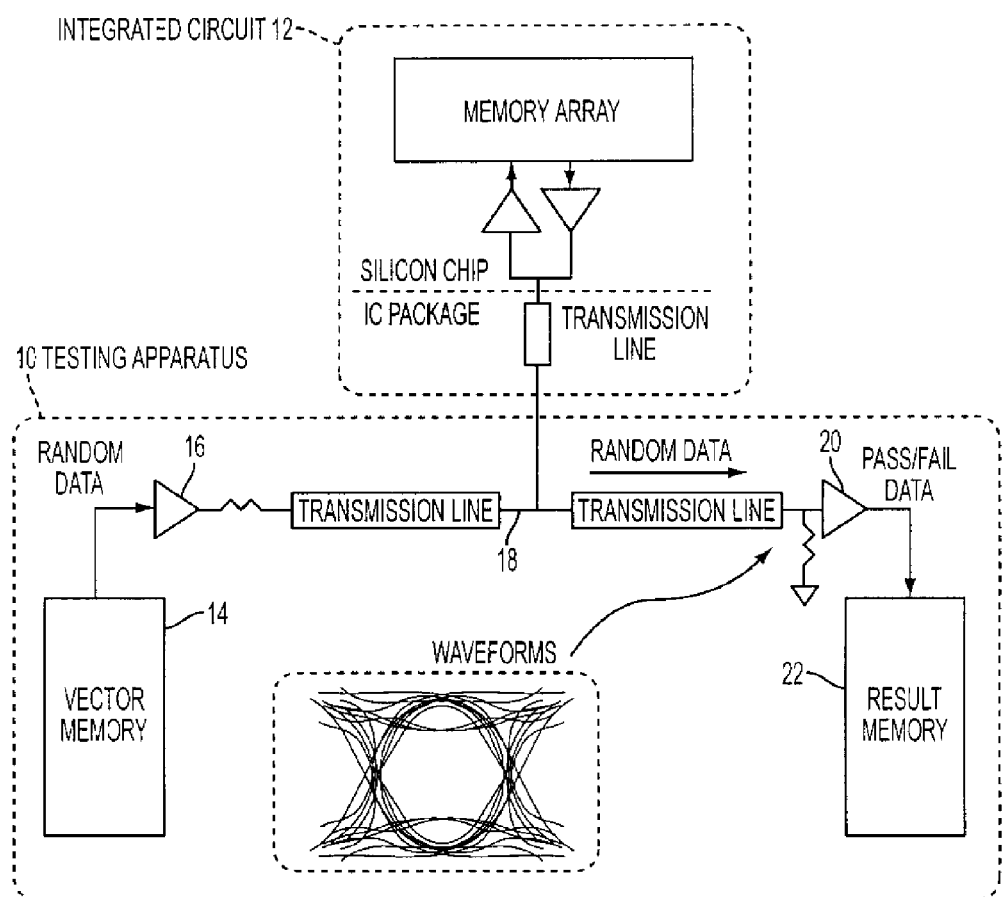
FIG. 1 shows a typical prior art apparatus for testing the operation of an integrated circuit (IC) memory device.
Figure 2:
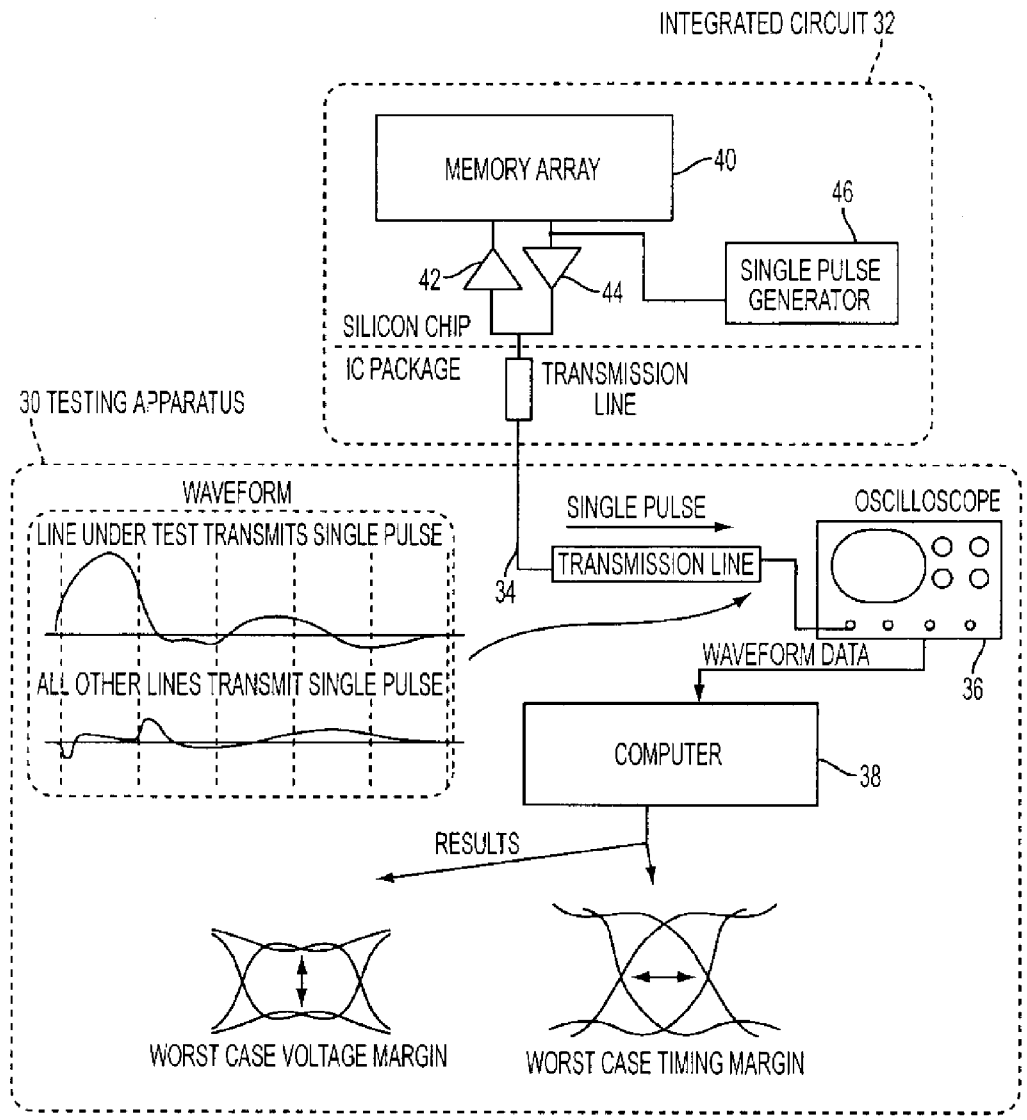
FIG. 2 shows an apparatus for determining the worst case performance characteristics of an integrated circuit (IC) device in accordance with the present disclosure.

Referring to FIG. 2, there is shown an apparatus 30 for determining the worst case performance characteristics of an integrated circuit (IC) device 32 in accordance with the present disclosure. The apparatus 30 comprises a transmission line 34 for receiving data signals from the IC device 32, and an oscilloscope 36 for capturing the timing and voltage characteristics of the received data signals. The apparatus 30 also comprises a computer 38 for calculating the worst case performance characteristics of the IC device 32 based upon the captured timing and voltage characteristics of the received data signals in accordance with the methods described below.

The IC device 32 comprises a memory array 40 for storing data. The IC device 32 also comprises a receiver 42 for receiving data from the transmission line 34 for storage in the memory array 40, and a transmitter 44 for transmitting data from the memory array 40 and onto the transmission line 34 for transmission to the apparatus 30. The IC device 32 further comprises a single pulse generator 46 for generating a single pulse data signal to be transmitted by the transmitter 44 onto the transmission line 34 for transmission to the apparatus 30.

At this point it should be noted that although only one receiver 42, transmitter 44, single pulse generator 46, transmission line 34, and oscilloscope 36 are shown, this arrangement may be duplicated as required based upon the number of input/output (I/O) lines of the IC device 32 to be measured.

It should also be noted that although the IC device 32 is shown in this particular embodiment as a memory device, the present disclosure is not limited in this regard. For example, it is within the scope of the present disclosure to utilize the methods described herein to determine the worst case performance characteristics of other types of electronic devices and systems, such as microprocessors, application specific integrated circuits (ASICs), and digital data busses.

In overview, the apparatus 30 is configured such that the worst case bit sequences and output margins of the IC device 32 can be calculated by measuring the single bit response (SBR) of the IC device 32. This SBR measurement involves acquiring two different waveforms at the oscilloscope 36. The first waveform is acquired when a single pulse data signal is generated by the single pulse generator 46 and transmitted by the transmitter 44 onto the transmission line 34. The second waveform is acquired when a single pulse data signal is generated and transmitted onto one or more adjacent transmission lines (not shown). Worst case bit sequences are then determined based upon these two acquired waveforms, as described in detail below. The worst case output margins of the IC device 32 can then be determined by having the IC device 32 transmit the worst case bit sequences and then measuring the resultant output waveforms at the oscilloscope 36. It should be noted, however, that there is no need to have the IC device 32 actually transmit the worst case bit sequences to determine the worst case output margins of the IC device 32. That is, as long as the system is linear and time invariant, the worst case output margins can be calculated by linear addition of simple responses, such as the SBR. Even if the system is nonlinear or time variant, as long as the non-linearity is weak, nearly worse case output margins can still be derived.

Figure 3:
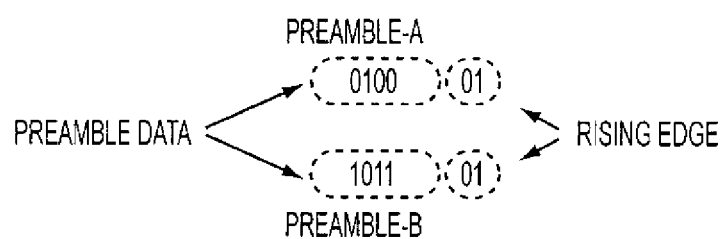
FIG. 3 shows an example worst case bit sequence that is divided into preamble and rising edge bits.

The worst case bit sequences are designed to produce worst case output margins (both timing and voltage) for specific edges (both rising or falling). The edges are typically distorted by reflections from data previously transmitted on the transmission line 34, as well as by data transmitted on adjacent transmission lines (not shown). Referring to FIG. 3, each worst case bit sequence is typically divided into two parts. The first part, called the "preamble", sets-up the reflections in advance. The second part comprises two bits which create either a rising edge (i.e., bits 01) or a falling edge (i.e., bits 10). The example presented in FIG. 3 shows a hypothetical preamble which causes worst case timing distortion. For example, assume that Preamble-A shifts the rising edge early. Then, its inverse, Preamble-B, will shift the rising edge late. This is true as long as the system is linear and time invariant.

Figure 4:
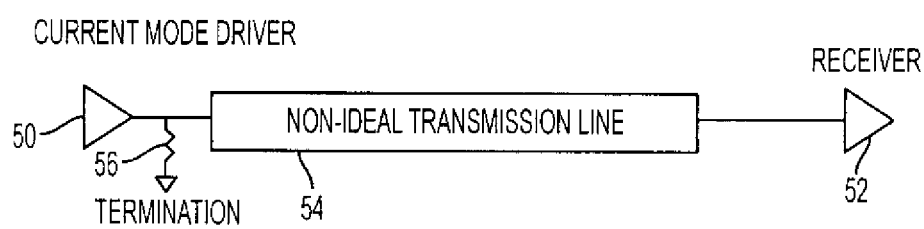
FIG. 4 shows a model transmission line representative of the transmission line shown in FIG. 2 and adjacent transmission lines.

The transmission line 34 can be one of multiple transmission lines of a data bus. If such is the case, the previously described adjacent transmission lines (not shown) typically make up the other transmission lines of the data bus. For purposes of example in this detailed description, it is assumed that this is the case. More particularly, it is assumed that transmission line 34 is the fourth bit (i.e., bit 3) of an eight bit data bus and the previously described adjacent transmission lines (not shown) make up the other bits (i.e., bits 0, 1, 2, 4, 5, 6, and 7) of the eight bit data bus. Referring to FIG. 4, there is shown a model transmission line representative of transmission line 34 and each of the previously described adjacent transmission lines (not otherwise shown). This model transmission line comprises a transmitter (i.e., a current mode driver) 50, a receiver 52, and a non-ideal transmission line 54 that is terminated by a resistor 56 located at a first end of the non-ideal transmission line 54. Alternatively, the non-ideal transmission line 54 may also be terminated by a second resistor located at a second end of the non-ideal transmission line 54. The transmission line 54 is non-ideal in that it has non-uniform impedance and is susceptible to coupling from adjacent transmission lines (not shown). It should be noted that worst case coupling occurs when the data that is transmitted on the adjacent transmission lines (not shown) is different from the data that is transmitted on transmission line 54. For this reason, and with respect to FIG. 2, transmission line 34 is referred to as the "victim" transmission line while the adjacent transmission lines (not shown) are referred to as the "aggressor" transmission lines.

Figure 5:
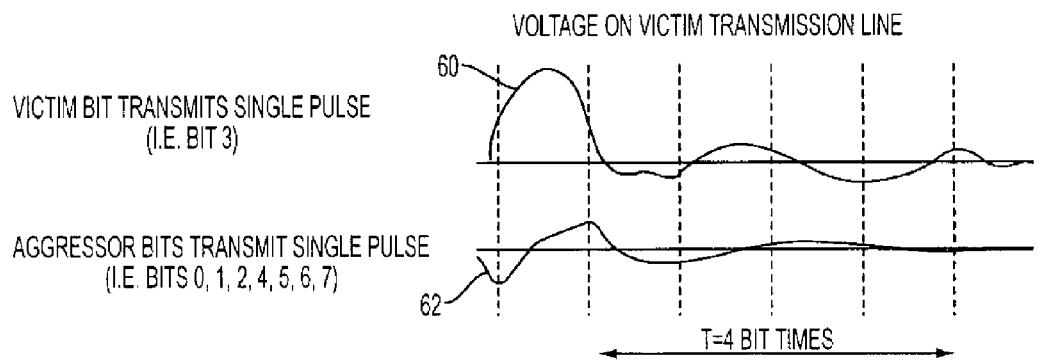
FIG. 5 illustrates a first waveform that is acquired when a single data bit is transmitted on a victim transmission line while adjacent aggressor transmission lines are inactive, and a second waveform that is acquired when a single data bit is transmitted on adjacent aggressor transmission lines while the victim transmission line is inactive; these two waveforms representing the single bit response (SBR) of the IC device shown in FIG. 2.

Referring back to FIG. 2, the worst case bit sequences are determined by first measuring the SBR of the IC device 32. As previously mentioned, the SBR measurement involves acquiring two different waveforms at the oscilloscope 36. The first waveform is acquired when a single data bit is transmitted on the victim transmission line 34 while the adjacent aggressor transmission lines (not shown) are inactive. The second waveform is acquired when a single data bit is transmitted on the adjacent aggressor transmission lines (not shown) while the victim transmission line 34 is inactive. FIG. 5 illustrates the first waveform 60 and the second waveform 62. These two waveforms 60 and 62 represent the SBR of the IC device 32.

From the first waveform 60 and the second waveform 62 it can be determined how long it takes for significant reflections to decay on the victim transmission line 34. This reflection decay time period is used to set the length of the preamble of the worst case bit sequences. For example, the first waveform 60 and the second waveform 62 show that the victim transmission line 34 returns to a quiescent level after 4 bit times. Therefore, the length of the preamble of the worst case bit sequences for the worst case timing margin is 4 bits long.

Once the SBR of the IC device 32, and hence the length of the preamble of the worst case bit sequences, is obtained, the worst case bit sequences for both the victim transmission line 34 and the adjacent aggressor transmission lines (not shown) for determining the worst case timing margin of the IC device 32 can be obtained. These worst case timing margin bit sequences are obtained by first determining the worst case timing margin bit sequence for the victim transmission line 34. This is accomplished by examining the first waveform 60.

Figure 6:
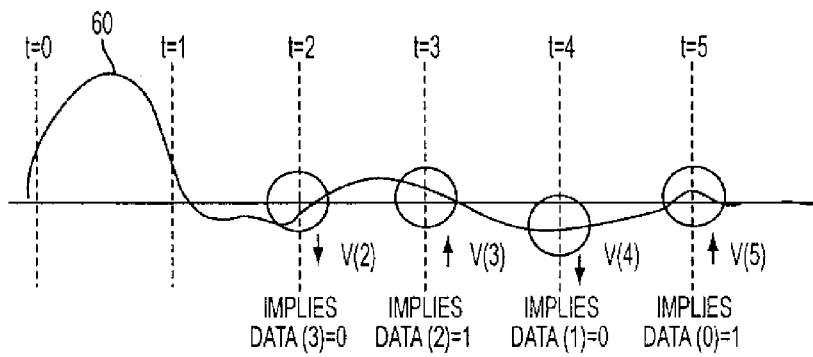
FIG. 6 illustrates how the first waveform of FIG. 5 is examined to determine the polarity of the SBR of the IC device shown in FIG. 2 and thus the worst case timing margin bit sequence for the victim transmission line.

Referring to FIG. 6, the first waveform 60 is examined to determine the polarity of the SBR of the IC device 32. That is, the worst case timing margin bit sequence for the victim transmission line 34 that will shift the victim transmission line timing in one direction (i.e., shift the rising edge early) is a logic 01 bit pattern (i.e., to yield a rising edge) preceded by four bits whose values depend on the polarity of the SBR of the IC device 32 at each data-cell boundary. Thus, the first waveform 60 is examined to determine the polarity of the SBR of the IC device 32 at each data-cell boundary. If the polarity at a data-cell boundary is positive, then the associated bit in the worst case timing margin bit sequence for the victim transmission line 34 is a logic one. Conversely, if the polarity at a data-cell boundary is negative, then the associated bit in the worst case timing margin bit sequence for the victim transmission line 34 is a logic zero.

The order of the bits in the worst case timing margin bit sequence for the victim transmission line 34 is determined by the order of the data-cell boundaries. That is, the bit value determined from the polarity of the most recent data-cell boundary is the first bit in the worst case timing margin bit sequence for the victim transmission line 34, the bit value determined from the polarity of the next most recent data-cell boundary is the second bit in the worst case timing margin bit sequence for the victim transmission line 34, and so on until the last data-cell boundary is reached. So, for the example shown in FIG. 6, the worst case timing margin bit sequence for the victim transmission line 34 is 101001. As previously mentioned, this worst case timing margin bit sequence for the victim transmission line 34 will shift the victim transmission line timing in one direction (i.e., shift the rising edge early). To shift the victim transmission line timing in the opposite direction (i.e., shift the rising edge late), the last two bits remain the same, and the precursor bits are inverted. Thus, for the example shown in FIG. 6, the complementary worst case timing margin bit sequence for the victim transmission line 34 is 010101.

Figure 7:
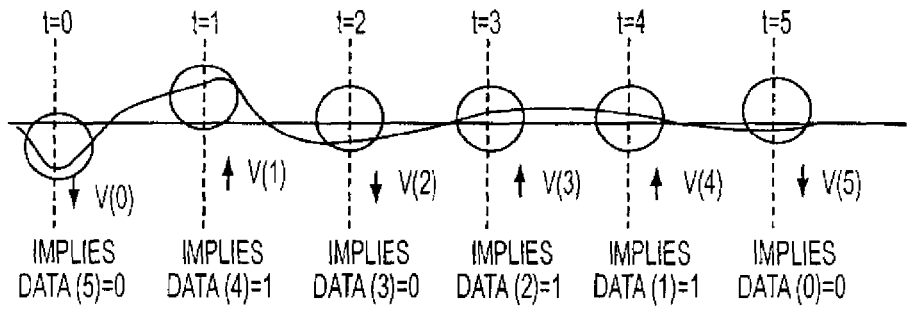
FIG. 7 illustrates how the second waveform of FIG. 5 is examined to determine the polarity of the SBR of the IC device shown in FIG. 2 and thus the worst case timing margin bit sequence for the aggressor transmission lines.

To obtain the worst case timing margin bit sequence for the aggressor transmission lines, the second waveform 62 is examined. Referring to FIG. 7, the second waveform 62 is examined to determine the polarity of the SBR of the IC device 32. That is, the worst case timing margin bit sequence for the aggressor transmission lines is six data bits long. The values of the six data bits depend on the polarity of the SBR of the IC device 32 at each data-cell boundary. Thus, the second waveform 62 is examined to determine the polarity of the SBR of the IC device 32 at each data-cell boundary. If the polarity at a data-cell boundary is positive, then the associated bit in the worst case timing margin bit sequence for the aggressor transmission lines is a logic one. Conversely, if the polarity at a data-cell boundary is negative, then the associated bit in the worst case timing margin bit sequence for the aggressor transmission lines is a logic zero.

The order of the bits in the worst case timing margin bit sequence for the aggressor transmission lines is determined by the order of the data-cell boundaries. That is, the bit value determined from the polarity of the most recent data-cell boundary is the first bit in the worst case timing margin bit sequence for the aggressor transmission lines, the bit value determined from the polarity of the next most recent data-cell boundary is the second bit in the worst case timing margin bit sequence for the aggressor transmission lines, and so on until the last data-cell boundary is reached. So, for the example shown in FIG. 7, the worst case timing margin bit sequence for the aggressor transmission lines is 011010. This worst case timing margin bit sequence for the aggressor transmission lines will shift the victim transmission line timing in one direction (i.e., shift the rising edge early). To shift the victim transmission line timing in the opposite direction (i.e., shift the rising edge late), all the bits on the aggressor transmission lines are inverted. Thus, for the example shown in FIG. 7, the complementary worst case timing margin bit sequence for the aggressor transmission lines is 100101.

At this point it should be noted that the absolute worst case timing error occurs in one direction (i.e., the rising edge occurs earliest) when the worst case timing margin bit sequence for the victim transmission line 34 is transmitted on the victim transmission line 34 at the same time as the worst case timing margin bit sequence for the aggressor transmission lines is transmitted on the aggressor transmission lines. Similarly, the absolute worst case timing error occurs in the opposite direction (i.e., the rising edge occurs latest) when the complementary worst case timing margin bit sequence for the victim transmission line 34 is transmitted on the victim transmission line 34 at the same time as the complementary worst case timing margin bit sequence for the aggressor transmission lines is transmitted on the aggressor transmission lines.

At this point it should be noted that, although the above-described technique for determining the worst case timing margin bit sequences is described above with respect to rising edge timing, this technique is directly applicable to falling edge timing as well.

Figure 8:
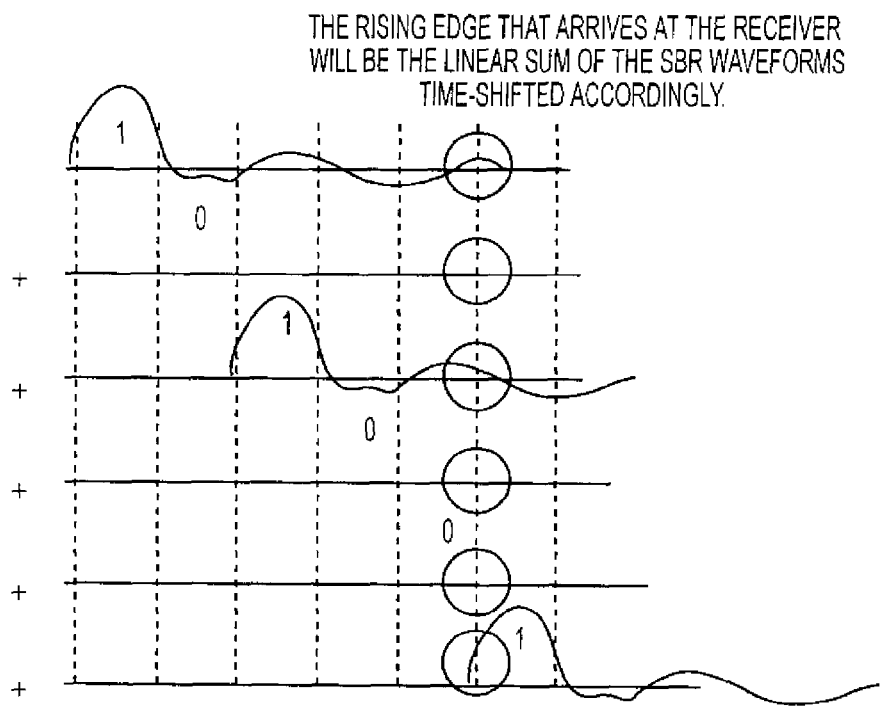
FIG. 8 illustrates how reflection noise is added on the victim transmission line of FIG. 2 when the worst case timing margin bit sequence for the victim transmission line is transmitted on the victim transmission line.

Referring to FIG. 8, there is shown an illustration of how reflection noise is added on the victim transmission line 34 when the worst case timing margin bit sequence for the victim transmission line 34 is transmitted on the victim transmission line 34. The resultant waveform shows the linear sum of the 3 SBR waveforms time shifted accordingly.

The SBR of the IC device 32 is also used to obtain the worst case bit sequences for both the victim transmission line 34 and the adjacent aggressor transmission lines (not shown) for determining the worst case voltage margin of the IC device 32. These worst case voltage margin bit sequences are obtained by first determining the worst case voltage margin bit sequence for the victim transmission line 34. This is accomplished by examining the first waveform 60.

Figure 9:
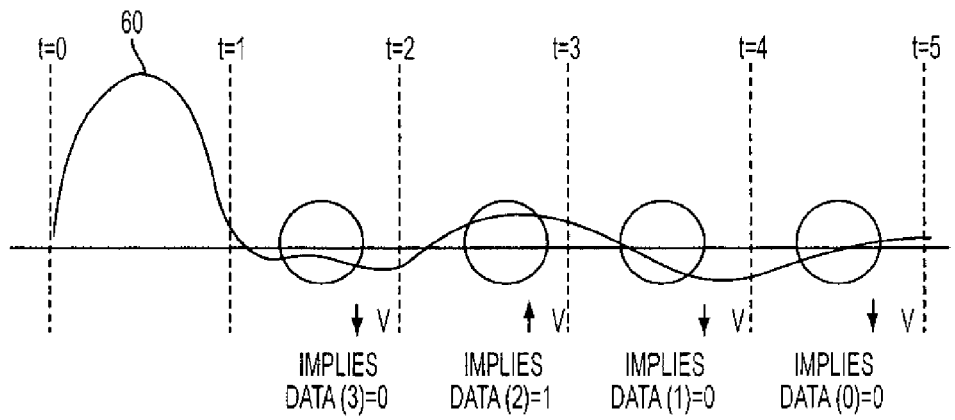
FIG. 9 illustrates how the first waveform is examined to determine the polarity of the SBR of the IC device of FIG. 2 and thus the worst case voltage margin bit sequence for the victim transmission line.

Referring to FIG. 9, the first waveform 60 is examined to determine the polarity of the SBR of the IC device 32. That is, the worst case voltage margin bit sequence for the victim transmission line 34 that will produce a worst case input low voltage margin on the victim transmission line 34 is a logic zero bit preceded by four bits whose values depend on the polarity of the SBR of the IC device 32 at the center of each data-cell. Thus, the first waveform 60 is examined to determine the polarity of the SBR of the IC device 32 at the center of each data-cell. If the polarity at the center of a data-cell is positive, then the associated bit in the worst case voltage margin bit sequence for the victim transmission line 34 is a logic one. Conversely, if the polarity at the center of a data-cell is negative, then the associated bit in the worst case voltage margin bit sequence for the victim transmission line 34 is a logic zero.

The order of the bits in the worst case voltage margin bit sequence for the victim transmission line 34 is determined by the order of the data-cells. That is, the bit value determined from the polarity of the most recent data-cell is the first bit in the worst case voltage margin bit sequence for the victim transmission line 34, the bit value determined from the polarity of the next most recent data-cell is the second bit in the worst case voltage margin bit sequence for the victim transmission line 34, and so on until the last data-cell is reached. So, for the example shown in FIG. 9, the worst case voltage margin bit sequence for the victim transmission line 34 is 00100. As previously mention, this worst case voltage margin bit sequence for the victim transmission line 34 will produce a worst case input low voltage margin on the victim transmission line 34. To produce a worst case input high voltage margin on the victim transmission line 34, the last bit is changed to a logic one and the precursor bits are inverted. Thus, for the example shown in FIG. 9, the complementary worst case voltage margin bit sequence for the victim transmission line 34 is 11011.

Figure 10:
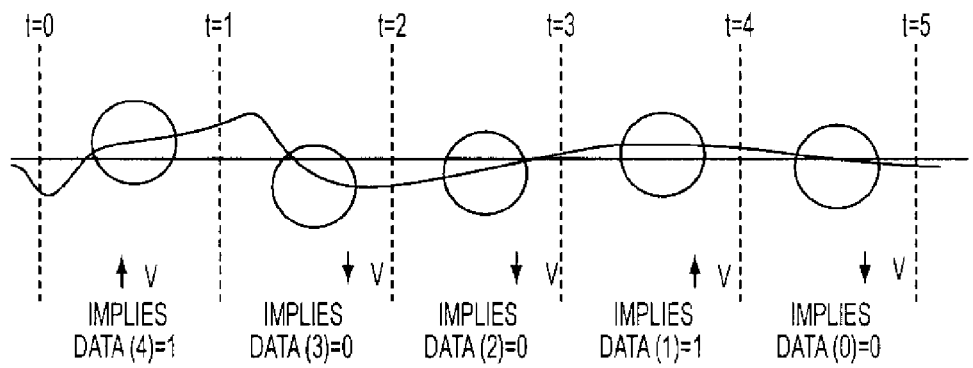
FIG. 10 illustrates how the second waveform is examined to determine the polarity of the SBR of the IC device of FIG. 2 and thus the worst case voltage margin bit sequence for the aggressor transmission lines.

To obtain the worst case voltage margin bit sequence for the aggressor transmission lines, the second waveform 62 is examined. Referring to FIG. 10, the second waveform 62 is examined to determine the polarity of the SBR of the IC device 32. That is, the worst case voltage margin bit sequence for the aggressor transmission lines is five bits long. The values of the five data bits depend on the polarity of the SBR of the IC device 32 at the center of each data-cell. Thus, the second waveform 62 is examined to determine the polarity of the SBR of the IC device 32 at the center of each data-cell. If the polarity at the center of a data-cell is positive, then the associated bit in the worst case voltage margin bit sequence for the aggressor transmission lines is a logic one. Conversely, if the polarity at the center of a data-cell is negative, then the associated bit in the worst case voltage margin bit sequence for the aggressor transmission lines is a logic zero.

The order of the bits in the worst case voltage margin bit sequence for the aggressor transmission lines is determined by the order of the data-cells. That is, the bit value determined from the polarity of the most recent data-cell is the first bit in the worst case voltage margin bit sequence for the aggressor transmission lines, the bit value determined from the polarity of the next most recent data-cell is the second bit in the worst case voltage margin bit sequence for the aggressor transmission lines, and so on until the last data-cell is reached. So, for the example shown in FIG. 10, the worst case voltage margin bit sequence for the aggressor transmission lines is 01001. This worst case voltage margin bit sequence for the aggressor transmission lines will produce a worst case input low voltage margin on the victim transmission line 34. To produce a worst case input high voltage margin on the victim transmission line 34, all the bits on the aggressor transmissions are inverted. Thus, for the example shown in FIG. 10, the complementary worst case voltage margin bit sequence for the aggressor transmission lines is 10110.

At this point it should be noted that the absolute worst case voltage error occurs for low voltage when the worst case voltage margin bit sequence for the victim transmission line 34 is transmitted on the victim transmission line 34 at the same time as the worst case voltage margin bit sequence for the aggressor transmission lines is transmitted on the aggressor transmission lines. Similarly, the absolute worst case voltage error occurs for high voltage when the complementary worst case voltage margin bit sequence for the victim transmission line 34 is transmitted on the victim transmission line 34 at the same time as the complementary worst case voltage margin bit sequence for the aggressor transmission lines is transmitted on the aggressor transmission lines.

Figure 11:
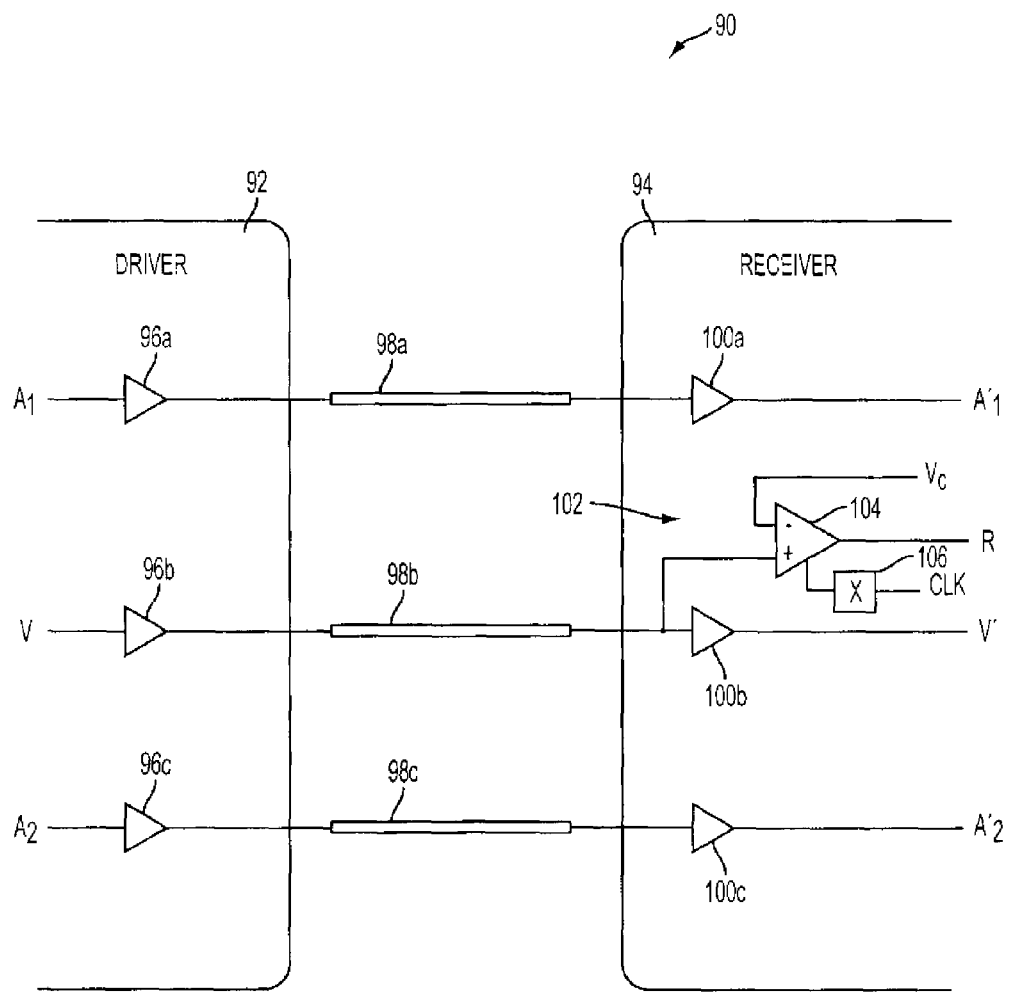
FIG. 11 shows an alternative embodiment of the present disclosure wherein a comparator circuit is beneficially contained in a receiver of a data transmission system such that the worst case performance characteristics of the entire data transmission system can be determined.

Referring to FIG. 11, there is shown an alternative embodiment of the present disclosure wherein a data transmission system 90 comprises a driver 92 and a receiver 94. The driver 92 includes a plurality of data transmitters 96 for transmitting data on a corresponding plurality of transmission lines 98. The receiver 94 includes a corresponding plurality of data receivers 100 for receiving the data transmitted on the plurality of transmission lines 98. The corresponding data transmitters 96, transmission lines 98, and data receivers 100 are arranged such that there is a victim (V) data transmitter 96*b*, transmission line 98*b*, and data receiver 100*b*, surrounded by adjacent aggressor (A1 and A2) data transmitters 96*a* and 96*c*, transmission lines 98*a* and 98*c*, and data receivers 100*a* and 100*c*.

The receiver 94 also includes a comparator circuit 102 comprising a comparator device 104 and a clock multiplier 106 for acquiring the timing and voltage characteristics of the data transmitted on transmission line 98*b*. It should be noted that although only one comparator circuit 102 is shown, a plurality of such comparator circuits could be provided (e.g., one for each transmission line 98).

The comparator circuit 102 operates by sampling the data transmitted on transmission line 98*b* at a rate that is faster than the rate at which the data is transmitted on the transmission line 98*b*. Thus, the clock multiplier 106 multiplies the clock signal, CLK, to provide the comparator device 104 with the appropriate sample rate. It should be noted that multiple phase-shifted clock signals may alternatively be used instead of the clock multiplier 106 to provide the comparator device 104 with the appropriate sample rate.

A comparison voltage, Vc, is provided to the comparator device 104 for determining the voltage level of the data transmitted on the transmission line 98*b*. The output (R) of the comparator device 104 is thus an indication of the voltage level of the data transmitted on the transmission line 98*b*. It should be noted that the level of the comparison voltage, Vc, is typically updated based upon feedback received from the output (R) of the comparator device 104.

The comparator circuit 102 is beneficially contained in the receiver 94 such that the worst case performance characteristics of the entire data transmission system 90 can be determined in accordance with the present disclosure as described in detail above.

Figure 12:
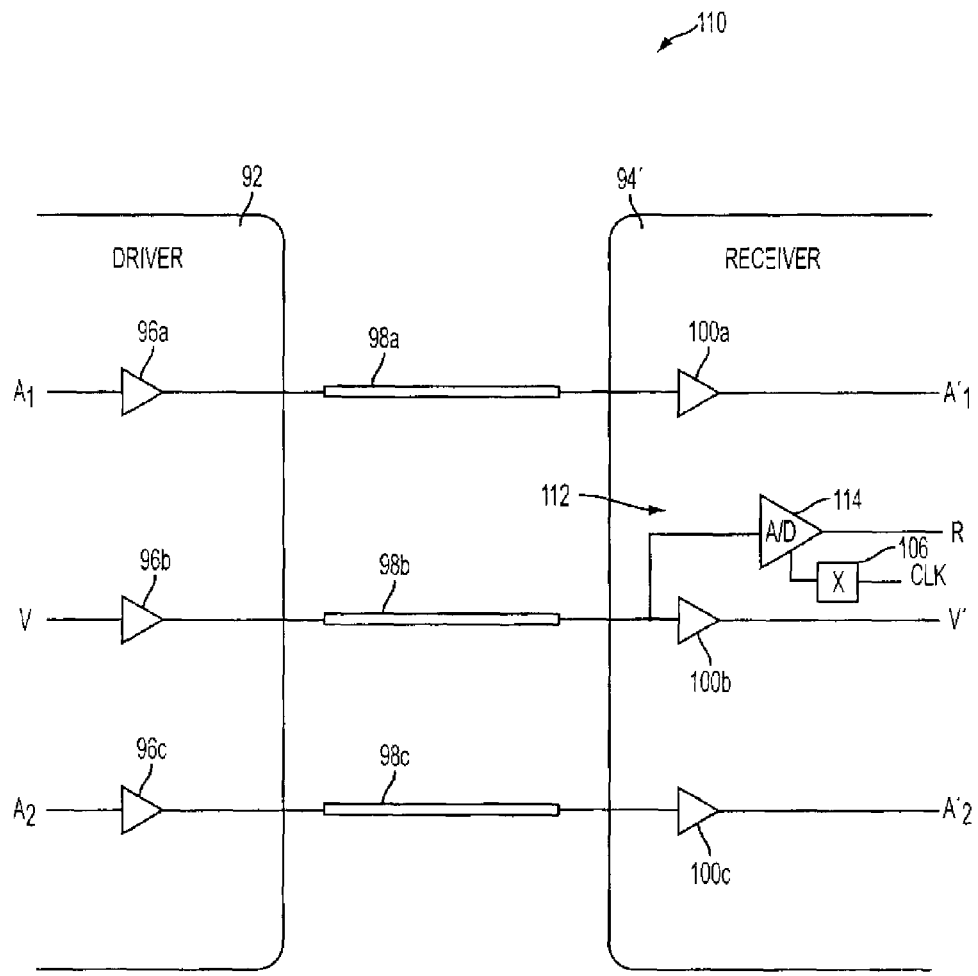
FIG. 12 shown an alternative embodiment of the present disclosure wherein an analog-to-digital converter circuit is beneficially contained in a receiver of a data transmission system such that the worst case performance characteristics of the entire data transmission system can be determined.

Referring to FIG. 12, there is shown another alternative embodiment of the present disclosure wherein a data transmission system 110 comprises the driver 92 and a receiver 94' having an analog-to-digital converter circuit 112. The analog-to-digital converter circuit 112 operates similar to the comparator circuit 102 of FIG. 11 by acquiring the timing and voltage characteristics of the data transmitted on transmission line 98*b* by sampling the data transmitted on transmission line 98*b* at a rate that is faster than rate at which the data is transmitted on the transmission line 98*b*. Similar to the comparator circuit 102 of FIG. 11, it should be noted that although only one analog-to-digital converter circuit 112 is shown, a plurality of such analog-to-digital converter circuits could be provided (e.g., one for each transmission line 98).

The analog-to-digital converter circuit 112 comprises a analog-to-digital converter 114 and the clock multiplier 106. The clock multiplier 106 multiplies the clock signal, CLK, to provide the analog-to-digital converter 114 with the appropriate sample rate. Again, it should be noted that multiple phase-shifted clock signals may alternatively be used instead of the clock multiplier 106 to provide the analog-to-digital converter 114 with the appropriate sample rate.

Similar to the comparator circuit 102 of FIG. 11, the analog-to-digital converter circuit 112 is beneficially contained in the receiver 94' such that the worst case performance characteristics of the entire data transmission system 110 can be determined in accordance with the present disclosure as described in detail above.

At this point it should be noted that measuring the single bit responses (SBRs) and determining the worst case bit sequences in accordance with the present disclosure as described above typically involve the processing of input data and the generation of output data to some extent. This input data processing and output data generation may be implemented in hardware or software. For example, specific electronic components may be employed in a data transmission system or in a testing apparatus for implementing the functions associated with measuring the single bit responses (SBRs) and determining the worst case bit sequences in accordance with the present disclosure as described above. Alternatively, a processor operating in accordance with stored instructions may implement the functions associated with measuring the single bit responses (SBRs) and determining the worst case bit sequences in accordance with the present disclosure as described above. If such is the case, it is within the scope of the present disclosure that such instructions may be transmitted to a data transmission system or a testing apparatus via one or more signals.

The present disclosure apparatus and method described herein suffer from none of the drawbacks associated with prior art as described above since the absolute worst case performance is calculated based upon waveforms produced by single pulses. Also, in accordance with the present disclosure, a measurement instrument can be measured in advance and an inverse transfer function can be applied to null-out ISI inherent in the measurement instrument.

The present disclosure apparatus and method are particularly useful for high-speed data transmission systems which have multiple reflections and significant coupling between lines such as, for example, a high-speed, low-cost memory bus.

The present disclosure is not to be limited in scope by the specific embodiments described herein. Indeed, various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure can be beneficially implemented in any number of environments for any number of purposes. Accordingly, the claims set forth below should be construed in view of the full breadth and spirit of the present disclosure as described herein.

The invention claimed is:

1. An apparatus for determining a performance characteristic of an integrated circuit in a signaling system, the integrated circuit having a transmitter, the apparatus to couple to the integrated circuit via a first transmission line, the apparatus comprising:
   a receiver to sample, using a sampling clock, a response on the first transmission line to the transmitting by the transmitter of a digital symbol on one of a first transmission line or a second transmission line, to obtain a digital sequence representing time-variant artifacts from the transmission of the digital symbol; and
   logic, including at least one of hardware or software, to determine the performance characteristic based on processing of the digital sequence.

2. The apparatus of claim 1, where the digital symbol includes a unit pulse.

3. The apparatus of claim 1, where the digital symbol includes one of a rising edge or a falling edge.

4. The apparatus of claim 3, where the digital symbol further comprises a preamble that is to precede the one of the rising edge or the falling edge.

5. The apparatus of claim 4, where the preamble is to have a length greater than or equal to a decay time of the one of the rising edge or falling edge at the receiver.

6. The apparatus of claim 1, where the logic to determine the performance characteristic is to identify from the time-variant artifacts one of a worst-case bit sequence for timing margins or a worst-case bit sequence for voltage margins in absence of transmitting the one of the worst-case bit sequence for timing margins or the worst-case bit sequence for voltage margins.

7. The apparatus of claim 6, where the logic to determine the performance characteristic is to identify the one of the worst-case bit sequence for timing margins or the worst-case bit sequence for voltage margins based on a combination of the digital sequence with at least one other sequence.

8. The apparatus of claim 7, where each of the digital sequence and the at least one other sequence is a response to transmission of at least one of a rising edge or a falling edge on the one of the first transmission line or the second transmission line.

9. The apparatus of claim 8, where each of the digital sequence and the at least one other sequence is a response to transmission of a unit pulse on the one of the first transmission line or the second transmission line.

10. The apparatus of claim 1, where:
the integrated circuit has a driver with plural data transmitters;
the apparatus further comprises receivers corresponding to the plural data transmitters, to couple to the integrated circuit via a corresponding plurality of data transmission lines;
the integrated circuit is to transmit plural digital symbols on respective ones of the data transmission lines as aggressor lines; and
the first transmission line is a victim line.

11. The apparatus of claim 1, where the logic to determine the performance characteristic comprises software.

12. The apparatus of claim 1, where the integrated circuit is an integrated circuit memory device encompassing the transmitter and a memory array, where the performance characteristic is a performance characteristic of the integrated circuit memory device.

13. The apparatus of claim 12, where:
the digital symbol includes a digital pulse;
the integrated circuit memory device includes a digital pulse generator to cause transmission of the digital pulse; and
the apparatus is embodied as a testing apparatus.

14. The apparatus of claim 12, where:
the digital symbol includes a digital pulse;
the integrated circuit memory device includes a digital pulse generator to cause transmission of the digital pulse; and
the apparatus further comprises a processor in the signaling system.

15. The apparatus of claim 1, where the symbol includes a bit transmitted for at least a unit interval and where the receiver is to oversample the first transmission line relative to the unit interval to produce the digital sequence.

16. The apparatus of claim 1, where the receiver comprises an analog to digital converter to produce the digital sequence.

17. The apparatus of claim 1, where the logic is to identify the performance characteristic dependence on a linear sum of the digital sequence with at least one other sequence.

18. The apparatus of claim 17, where each of the digital sequence and the at least one other sequence is a response to transmission of at least one of a rising edge or a falling edge on the one of the first transmission line or the second transmission line.

19. The apparatus of claim 1, where the digital sequence represents at least voltage polarities at data cell boundaries, and where the logic is to determine the performance characteristic dependent on the voltage polarities at data cell boundaries.

20. The apparatus of claim 1, where the transmitter is to transmit the digital symbol on the first transmission line.

21. The apparatus of claim 1, where the transmitter is to transmit the digital symbol on the second transmission line.

22. The apparatus of claim 1, where the logic to determine the performance characteristic is to do so upon a time-variant response at the receiver to transmission of the digital symbol on the first transmission line and upon a time-variant response at the receiver to transmission of the digital symbol on the second transmission line.

23. The apparatus of claim 22, where the first transmission line and the second transmission line are part of a parallel bus, and where the receiver is to sample each of reflection and cross-talk based interference for at least one line of the parallel bus.

24. The apparatus of claim 1, where the logic to determine the performance characteristic is to identify each of a victim-victim worst-case bit pattern and an aggressor-victim worst-case bit pattern, and is to identify at least one of a worst-case timing margin bit pattern or a worst-case voltage margin bit pattern as a function of both of the victim-victim worst-case bit pattern and the aggressor-victim worst-case bit pattern.

25. An apparatus for determining a performance characteristic of an integrated circuit in a signaling system, the integrated circuit having a transmitter, the apparatus to couple to the integrated circuit via a first transmission line, the apparatus comprising:
a receiver to sample, using a sampling clock, a response on the first transmission line to the transmitting by the transmitter of a digital symbol on one of a first transmission line or a second transmission line, to obtain a digital sequence representing time-variant artifacts from the transmission of the digital symbol; and
means for determining the performance characteristic based on processing of the digital sequence.

26. An apparatus for determining a performance characteristic of an integrated circuit in a signaling system, the integrated circuit having at least two data transmitters, the apparatus to couple to the at least two data transmitters via respective transmission lines, the apparatus comprising:
a data receiver to measure on a first transmission line time-variant artifacts responsive to transmission of a first digital symbol on the first transmission line by a first transmitter, and to measure on the first transmission line time-variant artifacts responsive to transmission of a second digital symbol on one or more second transmission lines; and
logic including at least one of hardware or software to determine a worst-case pattern based on processing the time-variant artifacts;
where each of the first digital symbol and the second digital symbol includes at least one of a rising edge, a falling edge or a unit pulse.

27. The apparatus of claim 26, where each of the first digital symbol and the second digital symbol further comprises a preamble having a duration greater than a time decay of the response on the first transmission line to respective transmission on the first transmission line and the one or more second transmission lines.

28. The apparatus of claim 26, where the logic to determine the worst-case pattern is to do so in absence of transmitting the worst-case pattern.

29. The apparatus of claim 26, where the logic to determine the worst-case pattern is to do so dependent on a combination of at least two digital sequences, each of the at least two digital sequences representing time-based samples of the time-variant artifacts.

* * * * *